United States Patent [19]
Katada et al.

[11] Patent Number: 5,334,870
[45] Date of Patent: Aug. 2, 1994

[54] COMPLEMENTARY MIS TRANSISTOR AND A FABRICATION PROCESS THEREOF

[75] Inventors: Mitsutaka Katada, Kariya; Hidetoshi Muramoto, Nagoya; Seizi Fuzino, Toyota; Tadashi Hattori, Okazaki; Katsunori Abe, Obu, all of Japan

[73] Assignee: Nippondenso Co. Ltd., Kariya, Japan

[21] Appl. No.: 46,699

[22] Filed: Apr. 16, 1993

[30] Foreign Application Priority Data

Apr. 17, 1992 [JP] Japan .................. 4-125606

[51] Int. Cl.⁵ .................. H01L 27/02; H01L 29/10
[52] U.S. Cl. .................. 257/371; 257/336; 257/344; 257/408; 257/653
[58] Field of Search .................. 257/371, 335, 336, 338, 257/344, 401, 408, 412, 653

[56] References Cited
U.S. PATENT DOCUMENTS

| | | | |
|---|---|---|---|
| 4,924,277 | 5/1990 | Yamane et al. | 357/23.3 |
| 5,061,975 | 10/1991 | Inuishi et al. | 357/23.4 |
| 5,122,474 | 6/1992 | Harringon, III | 437/44 |
| 5,170,232 | 12/1992 | Narita | 257/338 |
| 5,216,272 | 6/1993 | Kubokoya et al. | 257/409 |
| 5,247,198 | 9/1993 | Homma et al. | 257/371 |
| 5,247,199 | 9/1993 | Matlock | 257/371 |

FOREIGN PATENT DOCUMENTS

| | | |
|---|---|---|
| 1212470 | 8/1989 | Japan . |
| 1212471 | 8/1989 | Japan . |
| 3138951 | 6/1991 | Japan . |
| 4211178 | 8/1992 | Japan . |

Primary Examiner—Mark V. Prenty
Attorney, Agent, or Firm—Cushman, Darby & Cushman

[57] ABSTRACT

A CMIS transistor suitable for device miniaturization, elimination of degradation of operational characteristics by hot carrier effect, and elimination of decrease of threshold voltage caused by short channel effect, includes a laterally spreading N-type diffusion region having an impurity concentration level higher than P-type and N-type wells but lower than source and drain regions, such that the N-type diffusion region extends laterally into a part located immediately below an edge of an insulating gate and has a depth smaller than a depth of the source and drain regions. The device is thereby capable of increasing the width of depletion layer at the bottom of the source and drain regions while maintaining effectiveness as a punch-through stopper. Thereby, the junction capacitance at the source and drain regions is reduced and the operational speed of the device improved in the P-channel transistor part in the device. In the N-channel transistor part, an effective suppression of punch-through is achieved because of the small diffusion depth of the N-type diffusion region. Thereby, the decrease of threshold voltage caused by the short channel effect is effectively eliminated even when the gate length of the transistor is reduced.

9 Claims, 13 Drawing Sheets

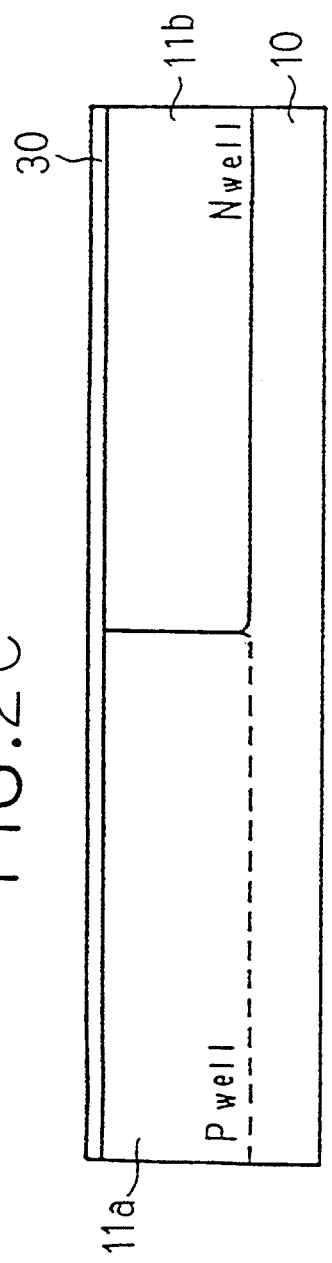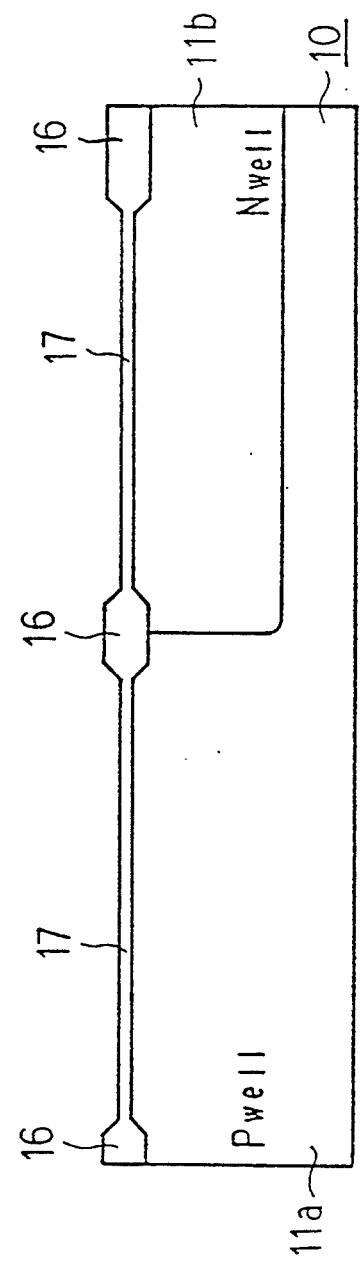

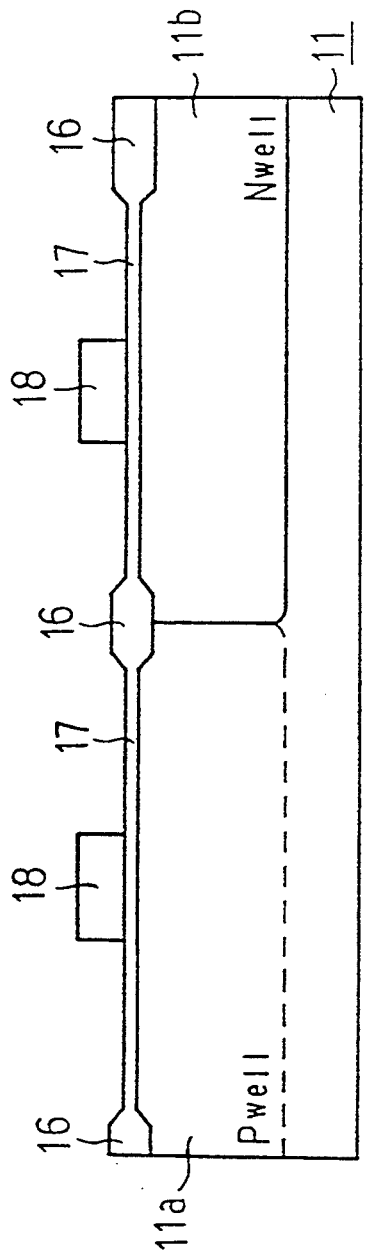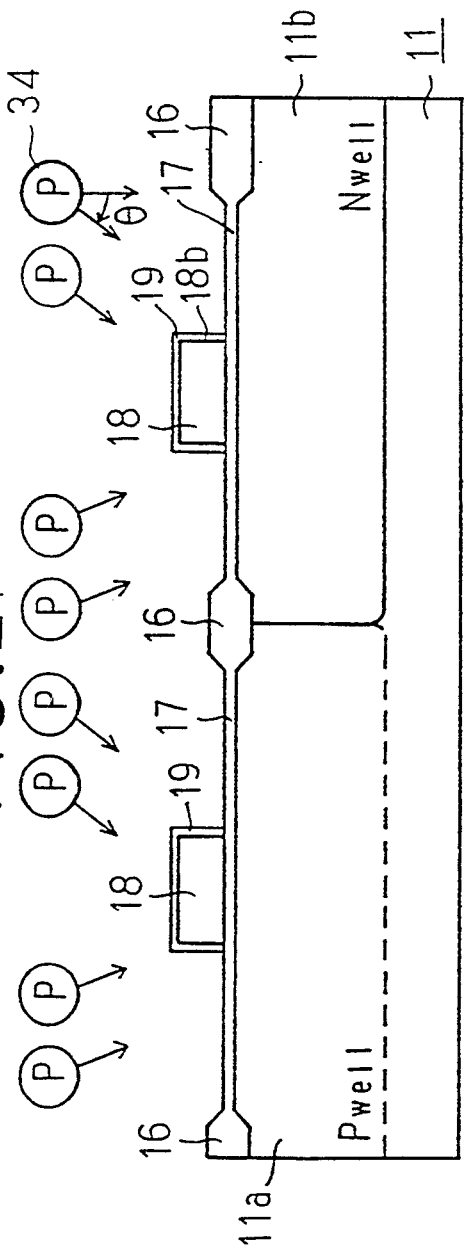

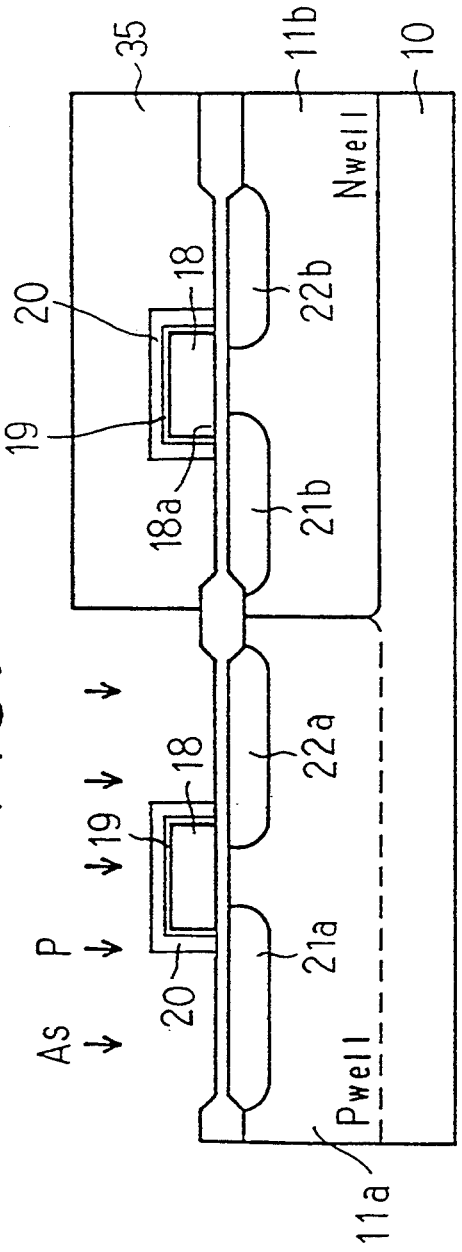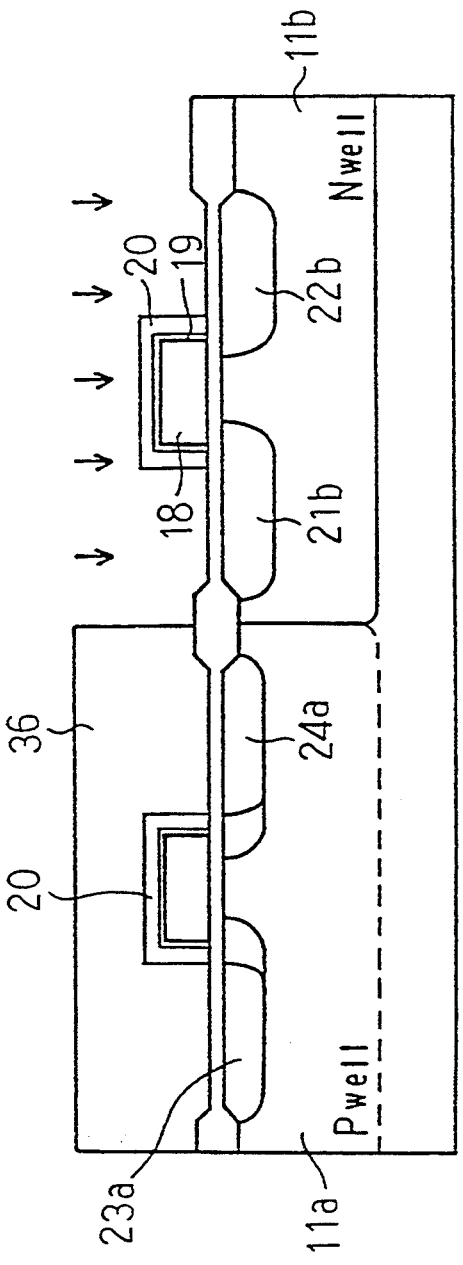

FIG.3A
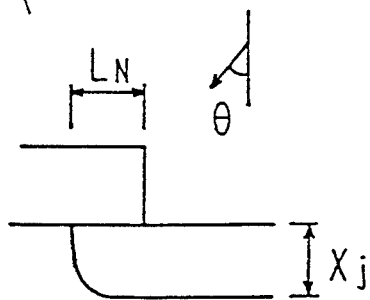
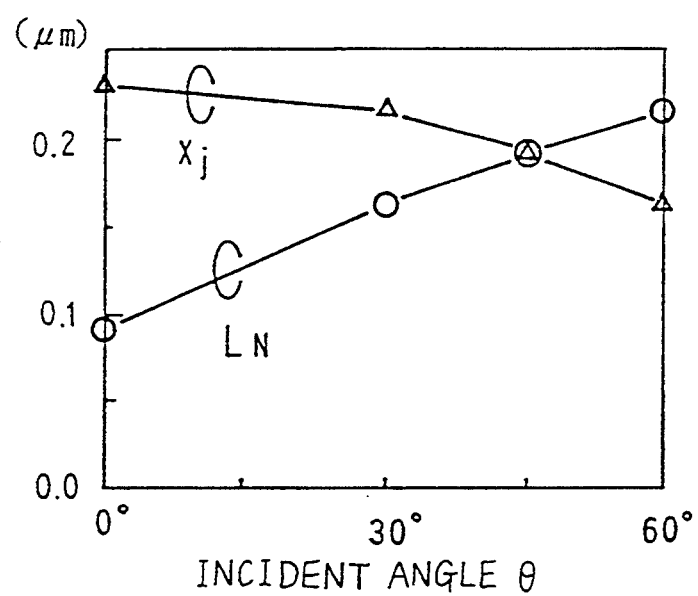
FIG.3B

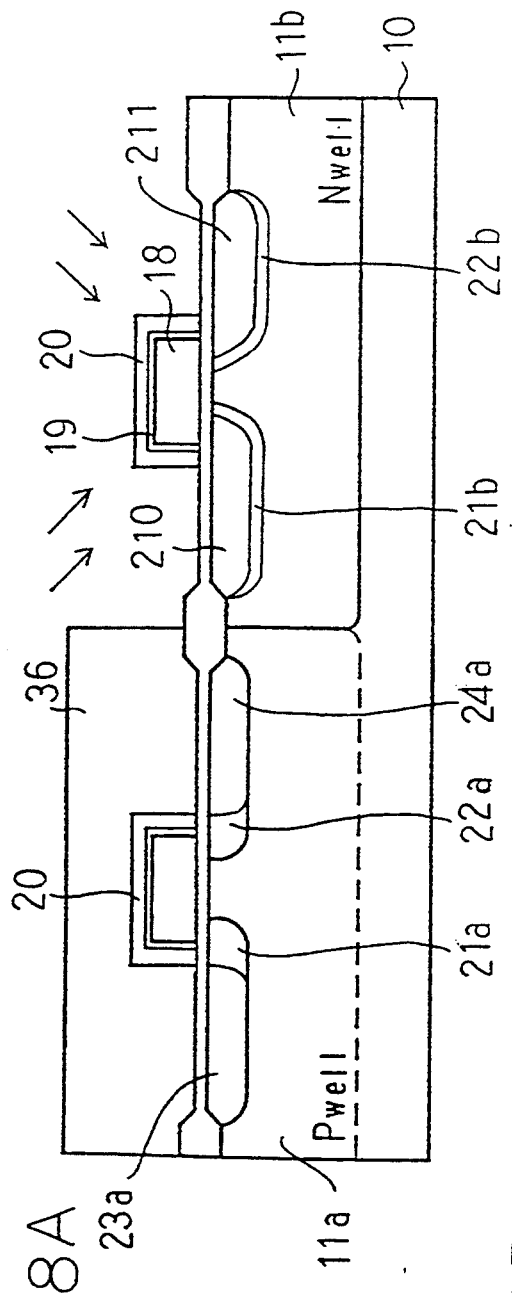
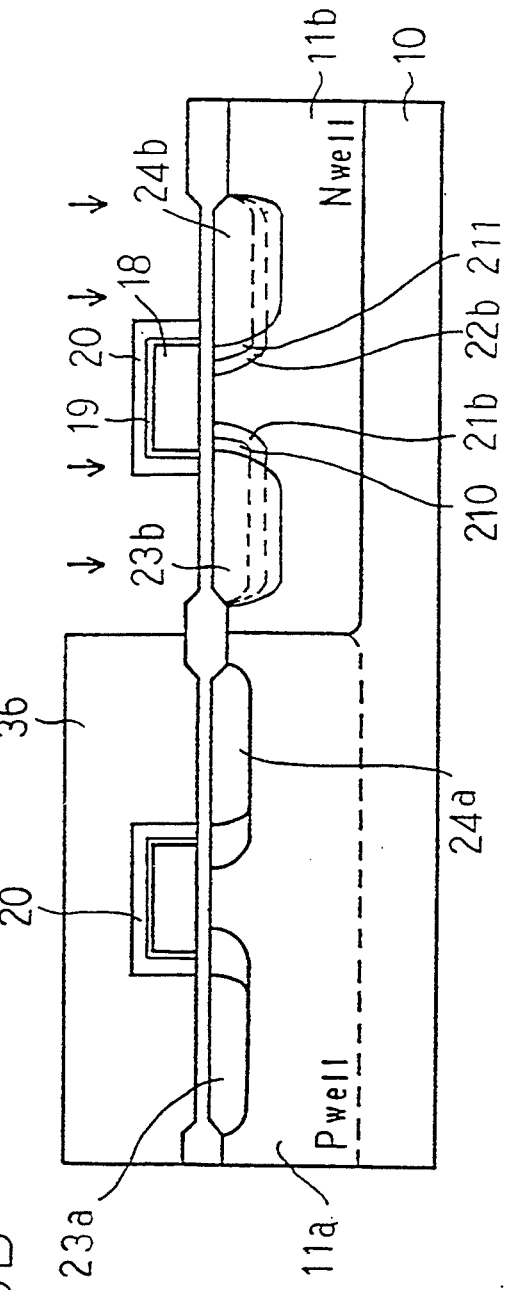
FIG. 8A
FIG. 8B

COMPLEMENTARY MIS TRANSISTOR AND A FABRICATION PROCESS THEREOF

BACKGROUND OF THE INVENTION

1. Field of the Invention

The present invention generally relates to complementary MIS transistors having P- and N-channels on a common substrate, and more particularly to a complementary MIS transistor including a well formed in a substrate, with source and drain regions formed in the well, wherein the distribution profile of impurities is optimized in the well and further in the source and drain regions for facilitating miniaturization of the device.

2. Description of the Related Arts

With recent progress in the fabrication process of miniaturized semiconductor devices, there is a tendency that the operation of miniaturized N-channel transistors tends to be affected by the hot carrier effect. Similarly, there is a tendency that modern P-channel transistors exhibit appreciable short channel effect. In any of these cases, the device suffers from the problem of variation of the threshold voltage, and such a variation of the threshold voltage has become a limiting factor for further miniaturization of the device.

In order to suppress the hot carrier effect in the N-channel MIS transistors, a so-called LDD (Lightly-Doped Drain) structure has been proposed. In the LDD structure, an N-type region of reduced impurity concentration level is formed adjacent to the usual N-type drain region for relaxing the large electric field formed adjacent to the drain region. When forming the drain region with such an LDD structure, on the other hand, it has been necessary to provide a mask to extend over a length larger than the gate length of the gate electrode. More specifically, there has been a need to form an oxide film to cover the side wall of the gate electrode as a mask by a deposition process such as CVD. Thus, the foregoing LDD structure has a drawback in that the fabrication process thereof inevitably becomes complex.

Meanwhile, the U.S. Pat. No. 4,924,277 describes a structure of a complementary MIS transistor that has an N-type diffusion region formed to surround the source region and the drain region in both the N-channel MIS transistor and the P-channel MIS transistor that form the complementary MIS transistor, such that the N-type diffusion region suppresses the hot carrier effect in the N-channel transistor by relaxing the electric field. In the P-channel transistor, on the other hand, the N-type diffusion region suppresses the short channel effect and reduces the punch-through effect.

FIG. 10 shows the structure proposed by the foregoing reference.

Referring to the drawing, the device includes a P-type silicon substrate 50 in which a P-type well 51a and an N-type well 51b are formed, wherein a P-channel transistor is formed on the N-type well 51b, while an N-channel transistor is formed on the P-type well 51a. Each transistor is isolated from the other transistor electrically by an isolation oxide film 56 that is formed by the usual LOCOS process. Further, the wells 51a and 51b carry thereon corresponding gate insulation films 57a and 57b, and the gate insulation films 57a and 57b in turn carry thereon corresponding gate electrodes 58a and 58b.

At both lateral sides of the gate electrode 58a, N-type diffusion regions 61a and 62a are formed according to a self-alignment process that uses the gate electrode 58a as a self-alignment mask. Similarly, N-type diffusion regions 61b and 62b are formed at both lateral sides of the gate electrode 58b while using the gate electrode 58b as a self-alignment mask. Further, an N-type diffusion region 63a of increased impurity concentration level is formed within the foregoing N-type diffusion region 61a as the source region of the N-channel transistor. Similarly, another N-type diffusion region 64a of increased impurity concentration level is formed within the N-type diffusion region 62a as the drain region of the same N-channel transistor. In the N-type diffusion region 61b, on the other hand, a P-type diffusion region 63b is formed as the source of the P-channel transistor with a large impurity concentration level, while in the N-type diffusion region 62b, another P-type diffusion region 64b of increased impurity concentration level is formed as the drain of the same P-channel transistor.

Referring to FIG. 10, it will be noted that each of the N-type diffusion regions 61a, 62a, 61b and 62b is formed to have an increased lateral size as well as increased vertical depth as compared with the corresponding diffusion region that is accommodated therein. Thus, the diffusion region 61a has a lateral size and a vertical depth larger than those of the diffusion region 63a, the diffusion region 62a has a lateral size and a vertical depth larger than those of the diffusion region 64a, the diffusion region 61b has a lateral size and a vertical depth larger than those of the diffusion region 63b, and the diffusion region 62b has a lateral size and a vertical depth larger than those of the diffusion region 64b. There, the foregoing N-type diffusion regions 61a, 62a, 61b and 62b are doped to have respective impurity concentration levels that are set higher than the 20 impurity concentration level of the corresponding P-type well 51a or corresponding N-type well 51b. Further, the impurity concentration levels of the foregoing diffusion regions 61a, 62a, 61b and 62b are set substantially smaller than the impurity concentration level of the corresponding N-type or P-type diffusion regions formed therein with increased impurity concentration level. Thus, the impurity concentration level of the diffusion region 61a is smaller than the impurity concentration level of the corresponding diffusion region 63a, the impurity concentration level of the diffusion region 62a is smaller than the impurity concentration level of the corresponding diffusion region 64a, the impurity concentration level of the diffusion region 61b is smaller than the impurity concentration level of the corresponding diffusion region 63b, and the impurity concentration level of the diffusion region 62b is smaller than the impurity concentration level of the corresponding diffusion region 64b.

Further, a passivation film 59, typically of a borophosphate glass, is provided so as to cover the oxide isolation film 56 as well as the gate oxide films 57a, 57b, and the gate electrodes 58a 58b. The passivation film 59 is provided with contact holes 70 for exposing the diffusion regions 63a and 64a as well as the diffusion regions 63b and 64b. In correspondence to the contact holes 70, ohmic electrodes 71 are provided.

In the complementary MIS transistor having the foregoing structure, the N-type diffusion region 62a, provided in the region of the N-channel transistor, causes a decrease in large electric field formed in the channel region in correspondence to the pinch-off point that in turn is formed adjacent to the drain region.

Thereby, the degradation of the device characteristics, caused for example by the avalanche injection of hot carriers into the gate oxide film 57a, is avoided successfully. In the P-channel transistor, the N-type diffusion region 62b functions as a punch-through stopper and suppresses the unwanted degradation of the device characteristics such as the decrease of threshold voltage. In the conventional P-channel MIS transistors that use polysilicon doped with phosphorus with a large concentration level for the gate electrode 58b, there has been a tendency that a metallurgical P-N junction, formed in the channel region immediately under the gate electrode as a buried channel structure, tends to cause punch-through of the carriers. Thus, conventional P-channel MIS transistors have been vulnerable to the short channel effect as compared with N-channel MIS transistors. As mentioned previously, the complementary MIS transistor of the foregoing prior art reference successfully suppresses the short channel effect pertinent to the conventional device by providing the N-type diffusion region 62b that acts as the punch-through stopper.

In the N-channel MIS transistor, it is essential to provide the N-type diffusion region 62a, which reduces electric field, to have a sufficiently large lateral size in order to achieve the desired suppression of hot carrier degradation. However, formation of the diffusion region to have such a large lateral size requires a long annealing time for the diffusion process, and such a prolonged diffusion process inevitably results in an increased depth of the diffusion region. Thereby, it will be understood that the controlled formation of the drain region becomes increasingly difficult with decreasing device size. Ultimately, one encounters the problem of short channel effect again, and the fabrication of the device with controlled threshold voltage becomes extremely difficult.

In the P-channel MIS transistor wherein the N-type diffusion regions 61b and 62b are formed within the N-type well 51b with an increased impurity concentration level as compared with the well 51b, the depth of the diffusion regions 61b and 62b becomes inevitably larger than the depth of the P-type diffusion regions 63b and 64b similarly to the N-channel transistor, as long as the diffusion regions 61b and 62b are formed to have an increased lateral size as compared with the diffusion regions 63b and 64b. Thereby, the depletion regions formed between the source region 63b and the N-type well 51b and between the drain region 64b and the N-type well 51b, inevitably have a width that is smaller than usual width of the depletion region formed in the P-channel MIS transistors. Such a reduction in the width of the depletion region in turn invites increase of junction capacitance and the operational speed of the device is deteriorated as a result.

SUMMARY OF THE INVENTION

The present invention is made in view of the foregoing problems pertinent to the conventional complementary MIS transistors. More specifically, it is the object of the present invention to provide a miniaturized complementary MIS transistor having a high operational speed, wherein the problem of degradation of the device characteristics, caused in the N-channel transistor by the hot carriers effect, and the problem of decrease of the threshold voltage, caused in the P-channel transistor by the short channel effect, are simultaneously and effectively eliminated, and wherein the capacitance at the P-N junction is reduced.

In order to achieve the foregoing object, the present invention provides a complementary MIS transistor comprising a substrate, an insulating gate, a source region, and a drain region, said substrate being formed with a P-type well and an N-type well, said source region and said drain region being formed in each of said P-type well and said N-type well, said complementary MIS transistor further including N-type diffusion regions formed in correspondence to the source and drain regions in each of the P-type well and the N-type well with an impurity concentration level that is lower than an impurity concentration level in the source and drain regions but higher than an impurity concentration level in the P-type and N-type wells, said N-type diffusion regions having a lateral size larger than a lateral size of the source and drain regions, wherein said N-type diffusion region is formed to extend laterally in said substrate in correspondence to a part located immediately below an edge of said insulating gate and further vertically with a depth that is smaller than a depth of said source or drain regions.

In the P-type well accommodating the N-channel transistor therein, the N-type region is formed to extend laterally in the substrate in correspondence to the part located immediately below both lateral edges of the insulating gate, with a depth that is smaller than the depth of the source and drain regions. Thereby, the N-type diffusion region, serving for the relaxation layer of electric field, is provided selectively in correspondence to the channel region, and the problem of short channel effect is effectively suppressed.

In the N-type well that accommodates the P-channel transistor, too, the N-type diffusion region is formed to extend laterally in the substrate in correspondence to the part located immediately below the lateral edges of the insulating gate, with a depth that is smaller than the depth of the source and drain regions. Thereby, the N-type diffusion region suppresses the short channel effect selectively in correspondence to the region wherein the channel is formed. In the part other than the channel, it should be noted that the source and drain regions establish a direct contact with the N-type well. Thereby, the electric field gradient is reduced and the junction capacitance is also reduced. With the foregoing reduction in the junction capacitance, the operational speed of the device is improved.

BRIEF DESCRIPTION OF THE DRAWINGS

FIGS. 2A–2H are cross sectional diagrams showing the fabrication process of the transistor of the first embodiment;

FIGS. 3A and 3B are characteristic diagrams according to the first embodiment showing the diffusion length and diffusion depth in the N-type diffusion region of the first embodiment transistor as a function of injection angle of ion implantation;

Figure 7:
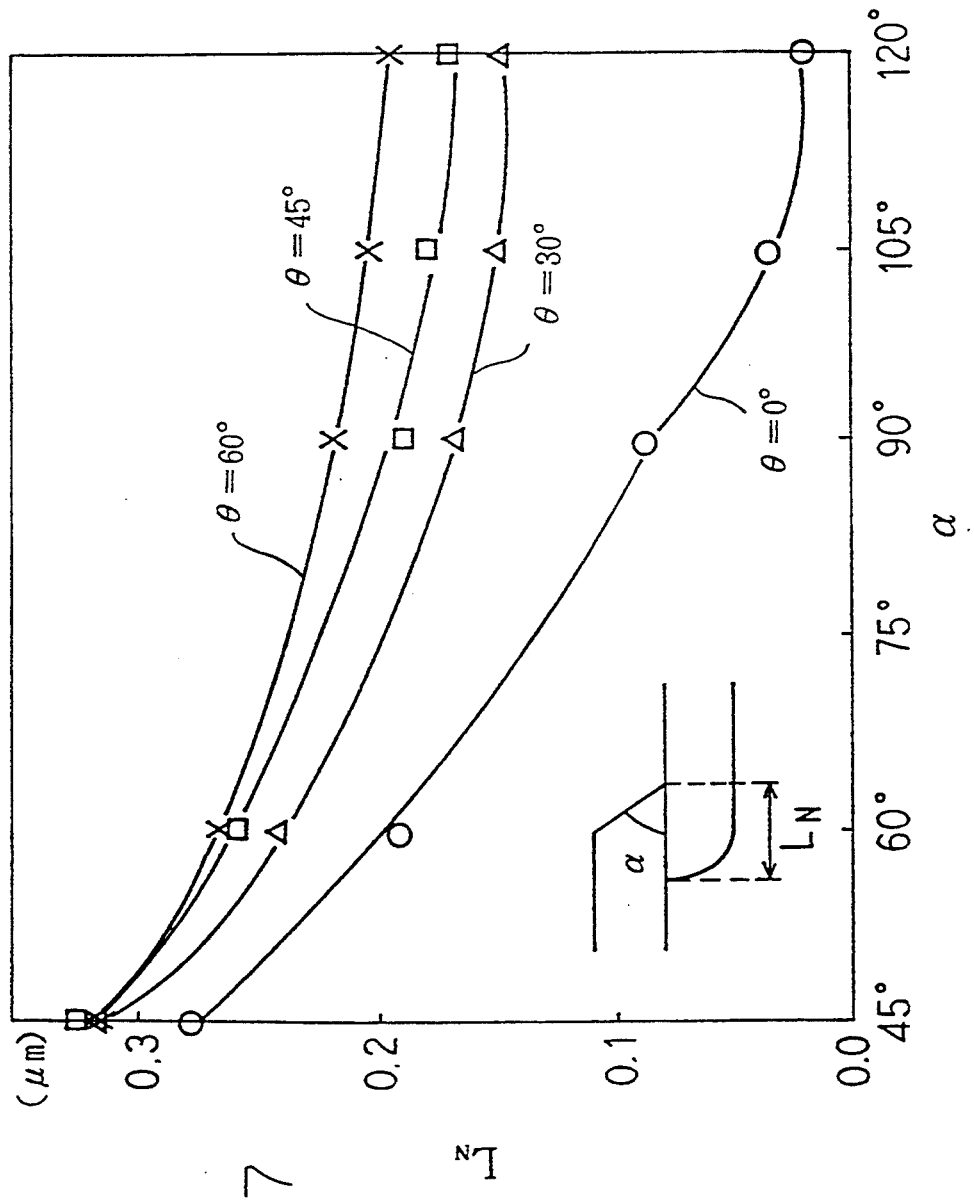
Figure 9A:
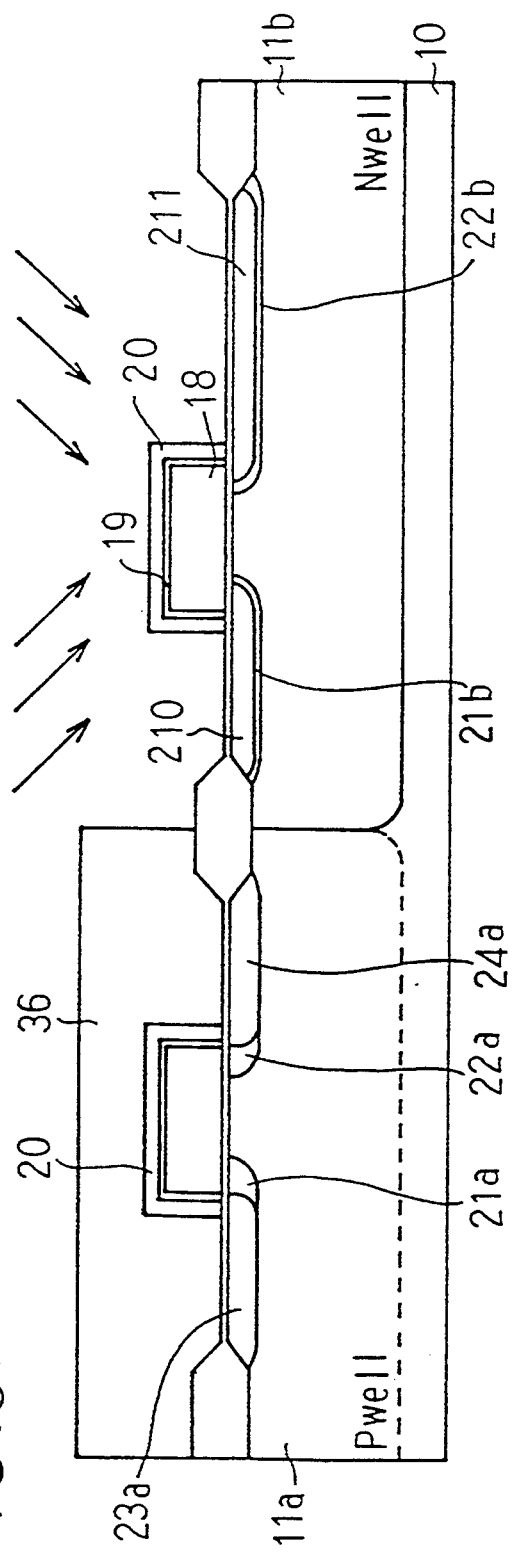
Figure 9B:
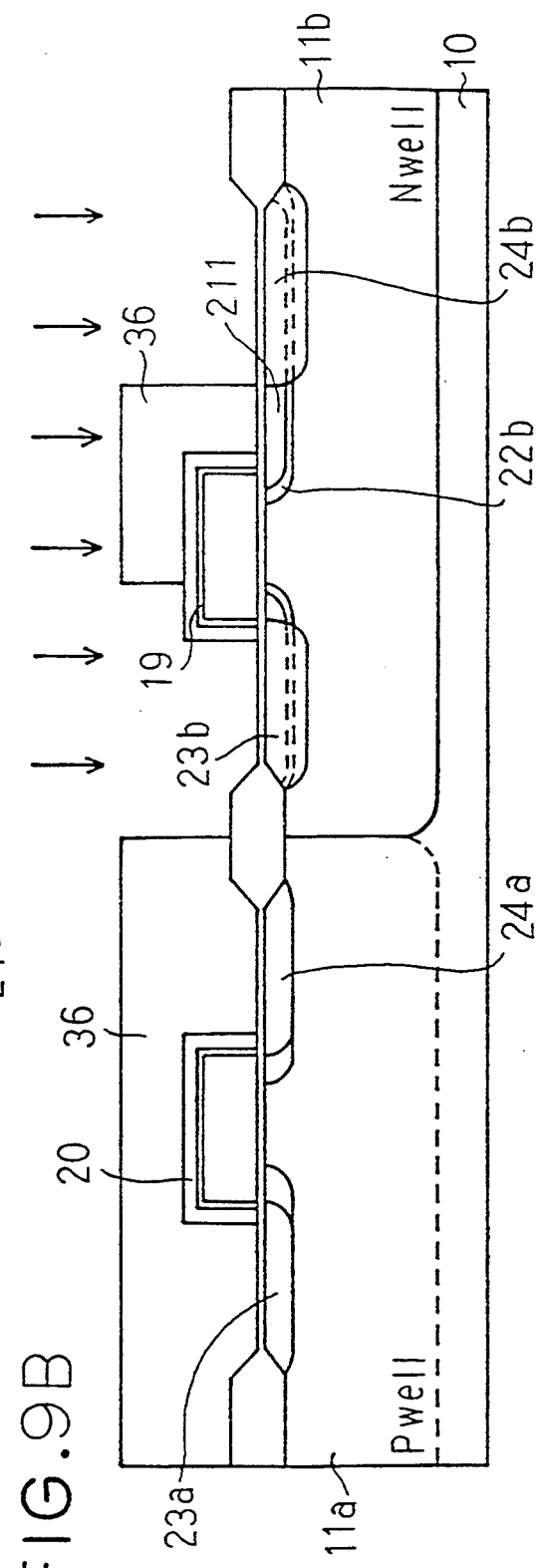
Figure 10:
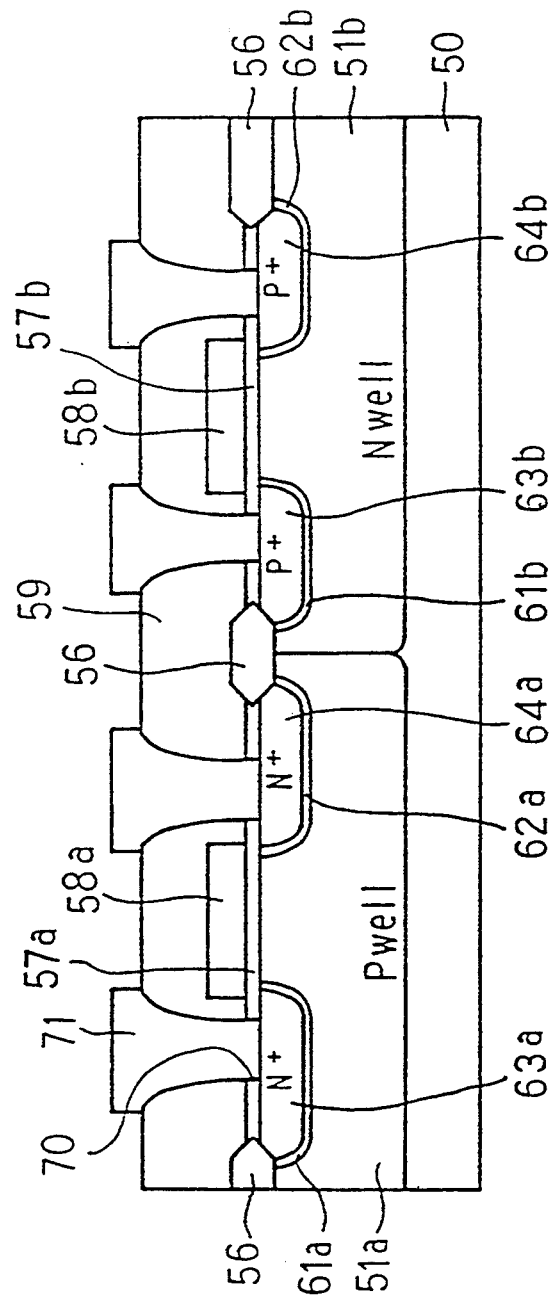

FIGS. 6A through 6E are diagrams showing a fabrication process of the transistor of a second embodiment of the present invention;

FIG. 7 is a characteristic diagram according to the second embodiment showing the lateral diffusion length as a function of the angle formed between the side wall of the gate electrode and the principal surface of the substrate, with the injection angle of ions in the ion implantation process as a parameter;

FIGS. 8A and 8B are cross sectional diagrams showing the fabrication process of the transistor according to a third embodiment of the present invention;

FIGS. 9A and 9B are diagrams showing the fabrication process of the transistor according to a fourth embodiment of the present invention; and FIG. 10 is a diagram showing the structure of a conventional CMOS transistor in the cross sectional view.

DETAILED DESCRIPTION OF PREFERRED EMBODIMENTS

Hereinafter, the present invention will be described with reference to preferred embodiments.

First Embodiment

Figure 1:
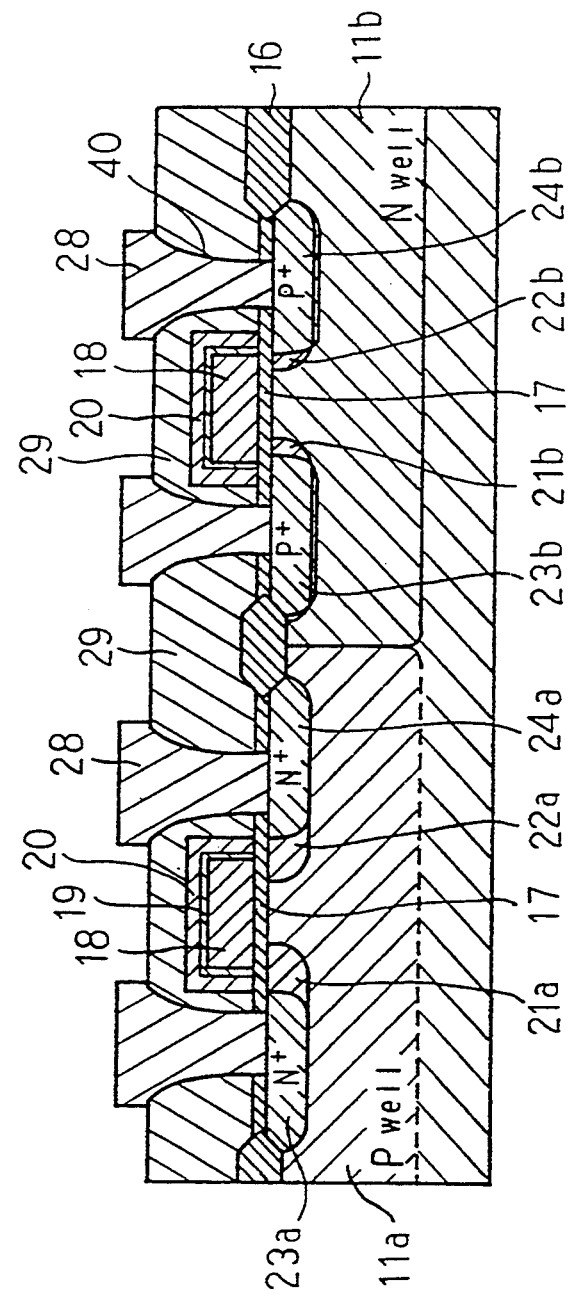
FIG. 1 is a cross sectional diagram showing the structure of a CMOS transistor according to a first embodiment of the present invention.

FIG. 1 shows a CMOS transistor forming a part of an integrated circuit in the cross sectional view, while FIGS. 2A through 2H are schematical cross sectional diagrams showing the fabrication process of the CMOS transistor of FIG. 1. The present invention will now be described according to the fabrication process of the transistor.

Figures 2A, 2B:
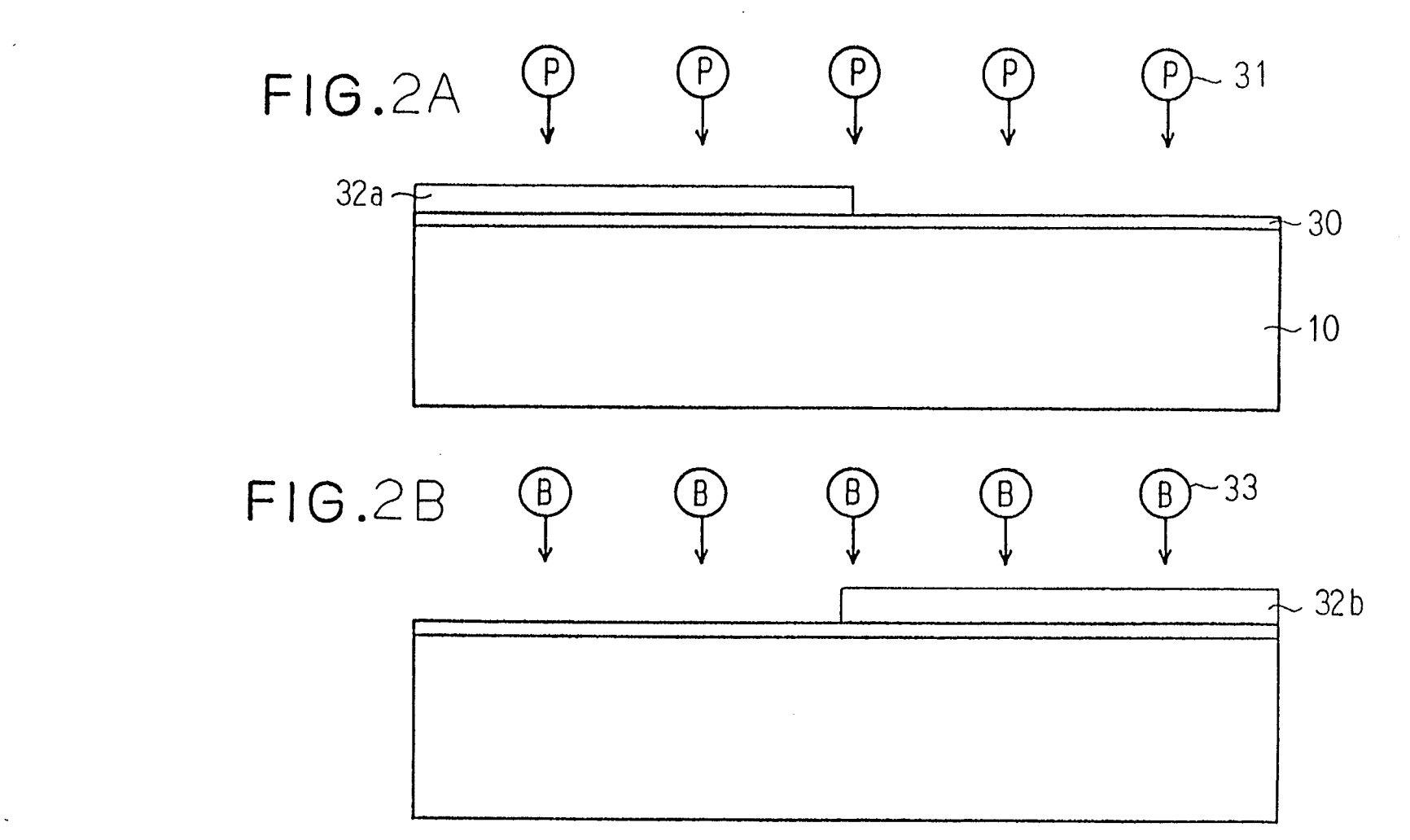

As shown in FIG. 2A, an oxide film 30 is provided on a P-type substrate 10 of a single crystal silicon for protecting the same from contamination. Next, a photoresist 32a is deposited and patterned photolithographically to cover the area of the substrate on which an N-channel transistor is to be formed. Further, an ion implantation of phosphorus ions 31 is conducted in correspondence to the region of the substrate wherein a P-channel transistor is to be formed.

Typically, the silicon substrate 10 is doped by boron with a concentration level of about $1 \times 10^{15}/cm^3$, while the ion implantation of phosphorus is achieved with a dose determined so as to realize an effective concentration level of donor at the surface of the substrate such that the P-channel transistor has a desired threshold level which satisfies the design specification of the P-channel transistor.

Next, as shown in FIG. 2B, the region of the substrate 10 other than the part wherein the N-channel transistor is to be formed is masked by a photoresist 32b, and an ion implantation of boron ions 33 is conducted selectively in correspondence to the region wherein the N-channel transistor is to be formed. The species used for the ion implantation in the process of FIG. 2B is not limited to boron ions but other species such as BF or $BF_2$ may also be used. The dose of the boron ions is determined such that an effective concentration level of acceptors, corresponding to the designed threshold voltage specified by the design specification of the N-channel transistor, is obtained at the surface of the substrate.

Next, the photoresist 32b is removed and a heat treatment process is applied to the substrate !0 for causing a diffusion of the phosphorus and boron ions thus introduced. Thereby, a P-type well 11a and an N-type well 11b are formed as shown in FIG. 2C. Further, an oxide film 30 is formed as a result of thermal oxidation associated with the heat treatment.

In the case when the P-channel and N-channel transistors use a polysilicon gate electrode, which will be described later, doped with phosphorus with high impurity concentration level and further in the case when the P-channel and N-channel transistors are formed to have an absolute threshold voltage of 0.5–1.2 volts, the P-type well 11a is formed to have an impurity concentration level at the surface part thereof such that the impurity concentration level of the well 11a is higher than the impurity conc-entration level of the surface part of the N-type well 11b, and further such that the P-type well 11a has a depth that is larger than the N-type well 11b. Thereby, the P-type well 11a establishes an electrical contact with the substrate 10. On the other hand, the N-type well 11b is electrically isolated from the substrate 10.

After the P-type well 11a and the N-type well 11b are formed as such, the field oxide film 16 for device isolation and the gate oxide film 17 are formed as shown in FIG. 2D. Further, in correspondence to the device region formed as such, a gate electrode 18 of $N^+$-type polysilicon doped with phosphorus with a high concentration level is formed as shown in FIG. 2E. Further, any photoresist usually remaining after the etching process of the gate electrode 18, is removed by an ashing process or by dissolving into an oxidizing solution typically formed of a mixture of concentrated sulfuric acid, hydrogen peroxide and water.

After the foregoing process for forming the gate electrode 18, an insulating film 19 of amorphous material such as oxide, nitride, titanium oxide, or titanium nitride is provided on the gate electrode 18 thus formed by a thermal oxidation process, thermal nitriding process, sputtering, chemical vapor deposition, or evaporation deposition. The insulation film 19 is used for suppressing the channeling of phosphorus ions wherein phosphorus ions pass through the gate electrode 18 without being scattered by the gate electrode. The insulation film 19 is conveniently formed by the thermal oxidation process, wherein a high density film can be obtained for the insulation film 19 with an excellent adherence to the gate electrode 18. The preferable thickness of the film 19 depends on the acceleration voltage of phosphorus employed during the ion implantation. When the acceleration voltage is set to about 50 keV, a thickness of about 10 nm is sufficient for the insulation film 19.

After the insulation film 19 is formed, phosphorus ions 34 are implanted with an incident angle $\theta$ of more than 10 degrees, wherein the incident angle $\theta$ is defined as the angle formed between the ion beam and a normal drawn perpendicular to the principal surface of the substrate 10. In the actual fabrication process, the substrate 10 is held obliquely by an angle $\theta$, wherein the ion injection is achieved without using ordinary photolithographic process but by using the insulation film 19 and the gate electrode 18 as the mask. When the transistor is required to have symmetry, the ion implantation process is conducted again while holding the substrate 11 at another angle $\theta$. Further, when the gate electrode 18 is formed to extend parallel to the plane of the drawing, the ion implantation process may be achieved by simply rotating the substrate 11 by 90 degrees.

As a result of the ion implantation conducted as such, it becomes possible to implant the phosphorus ions such that the ions penetrate into the region that is located immediately below the gate electrode 18 and is defined by both lateral edges of the gate electrode 18, passing through the side walls 18b of the gate electrode 18. In the ion implantation process, a projected range Rp(E) is used for representing the depth profile of the implanted ions as a function of the acceleration energy E. When the ion beam is injected with the injection angle $\theta$, the projected range for a given acceleration energy E is represented as Rp(E)·cos$\theta$. Thereby, it will be noted that one can reduce the vertical penetration of the ions into the substrate. Thereby, the condition of ion implantation is set with respect to the acceleration voltage, dose and the injection angle, such that the punch-through is eliminated in the P-channel transistor and such that the N-type diffusion region is formed with a lateral length sufficient for decreasing electric field in the N-channel transistor and its hot-carrier life becomes satisfactorily long.

In the state immediately after the ion implantation, the impurity ions thus introduced distribute in the substrate laterally and extend into the region located immediately below the gate. Thereby, the depth of penetration of the impurity ions is much smaller than the case wherein the ions are introduced according to the conventional process in which ions are implanted substantially perpendicularly to the principal surface of the substrate. Thus, by applying a heat treatment process to the substrate that contains impurity elements thus nitriding, one can achieve a laterally spreading distribution of impurity elements with minimum penetration in the vertical direction. Such a impurity profile could not be achieved according to the conventional ion implantation process.

After this, the substrate 10 is subjected to an appropriate heat treatment process, and N-type diffusion regions 21a, 22a, 21b and 21b are formed in correspondence to the P-type well 11a and the N-type well as shown in FIG. 2G, with an impurity concentration level such that the impurity concentration level exceeds the impurity concentration level of the wells 11a and 11b by three to thirty times. Thereby, the N-type diffusion regions 21a and 22b in the N-channel transistor decrease the electric filed. Further, the N-type diffusion regions 21b and 22b in the P-channel transistor suppress the punch-through between source and drain. It should be noted that a depth of 0.2 $\mu$m is sufficient for the diffusion regions 21a, 22a, 21b and 22b for performing the foregoing functions.

FIG. 3B shows the impurity distribution profile after ion implantation, conducted with an acceleration voltage of 80 keV, for forming the N-type diffusion regions 21a, 22a, 21b and 22b, with respect to the depth $X_j$ of the junction formed as a result of the ion implantation and the lateral diffusion length $L_N$ obtained in the region immediately below the gate, as a function of the incident angle $\theta$(see FIG. 3A). In the conventional process that injects ions vertically to the substrate, it should be noted that the depth of junction immediately after ion implantation reaches as much as 0.6 $\mu$m or more if the diffusion region is formed to have a lateral diffusion length of 0.2 $\mu$m. By setting the incident angle $\theta$ to be more than 45 degrees, it is possible to form the diffusion region with a form such that the lateral spreading of the diffusion region is comparable to the vertical diffusion depth. Thereby, the N-channel transistor according to the present embodiment provides a device structure that is capable of decreasing the electric field while simultaneously suppressing the variation of the threshold voltage caused by the short channel effect. In the device structure of the present embodiment, it should be noted that the N-type diffusion region 22a acting as the relaxing layer of electric field is formed immediately below the edge of the gate electrode 18.

Next, the insulation film 19 covering the gate electrode 18 is further covered by an insulation film 20 of silicon oxide, silicon nitride, titanium oxide or titanium nitride, by applying a thermal oxidation process, thermal nitriding process, sputtering, or evaporation deposition. Particularly, the insulation film 20 can be formed conveniently by the thermal oxidation process similarly to the insulation film 19. By forming the insulation film 20 as such, a bird's beak is formed at an edge part 18a of the gate and the breakdown voltage of the gate is improved. It is desirable to form the insulation film 20 to have a thickness of more than 20 nm, preferably about 100 nm.

Next, as shown in FIG. 2G, the P-channel transistor is covered by depositing and patterning a resist 35 according to the photolithographic process, and an ion implantation of arsenic is conducted selectively into the N-type diffusion regions 21a and 21b formed in the P-type well 11a, while using the gate electrode 18 and the insulation film 20 as a mask. Thereby, source and drain regions 23a and 24a are formed. In the ion implantation process, one may use phosphorus simultaneously with arsenic. When phosphorus and arsenic are simultaneously introduced, the concentration profile changes continuously toward the channel, and one can reduce the on-resistance of the transistor. In the process described heretofore, it is possible to obtain a structure wherein the N-type diffusion regions 21a and 22a have a depth smaller than the depth of the source and drain regions 23a and 24a, and wherein the N-type diffusion regions 21a and 22a have a lateral extension in the direction of the principal surface of the substrate 10 such that the lateral extension is larger than a corresponding lateral extension of the source and drain regions 23a and 24a when compared at the same depth, as long as the comparison is made at a depth smaller than 0.5 $\mu$m. Thereby, the N-type diffusion regions 21a and 22a have an increased size in the direction parallel to the principal surface of the substrate 10.

Next, as shown in FIG. 2H, the P-type well region 11a is masked by a patterned resist 36. Further, an ion implantation of boron, BF, or BF$_2$ is conducted selectively into the N-type diffusion regions 21b and 22b in the N-type well 11b, by using the gate electrode 18 and the insulation film 20 as a mask. The ions thus incorporated are then subjected to a thermal diffusion process as usual. Thereby, source and drain regions 23b and 24b are formed as shown in FIG. 1. Thereby, the dose of ion implantation process and the condition of thermal diffusion process are controlled such that the source and drain regions 23b and 24b have a depth larger than the depth of the N-type diffusion regions 21b and 22b, and such that the lateral length of the source and drain regions 23b and 24b do not exceed the lateral length of the N-type diffusion regions 21b and 22b. More specifically, a sheet resistance of 150 $\Omega/\square$ or less is obtained by setting the acceleration voltage to 70 keV or more and setting the dose of ion implantation to $8 \times 10^{14}/\text{cm}^2$. Thereby, it is possible to control the depth of the source and drain regions 23b and 24b to be 0.2 $\mu$m or more. In other words, one can form the source and drain regions 23b and 24b to be sufficiently larger than the foregoing depth of 0.2 μm for the N-type diffusion regions 21b and 22b.

Next, a passivation film 29 of oxide, nitride, phosphosilicate glass (PSG), or borophosphosilicate glass (BPSG), is deposited as shown in FIG. 1 for example by the CVD process, sputtering or evaporation deposition. Further, contact holes 40 are provided in the passivation film 29 in correspondence to the source region, drain region and the gate electrode, and an electrode is provided by depositing and patterning an electrode layer of a conductive material such as aluminum such that the electrode 28 establishes a contact at the respective contact holes 40. Thereby, the fabrication of the CMOS transistor is completed.

Figure 4A:
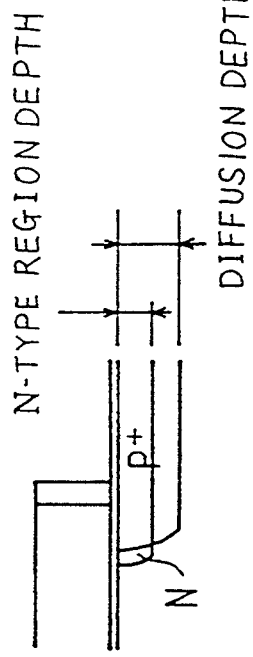
FIGS. 4A and 4B are characteristic diagrams showing the diffusion depth and threshold voltage of a P-channel transistor included in the device of the first embodiment as a function of dose of $BF_2$.
Figure 4B:
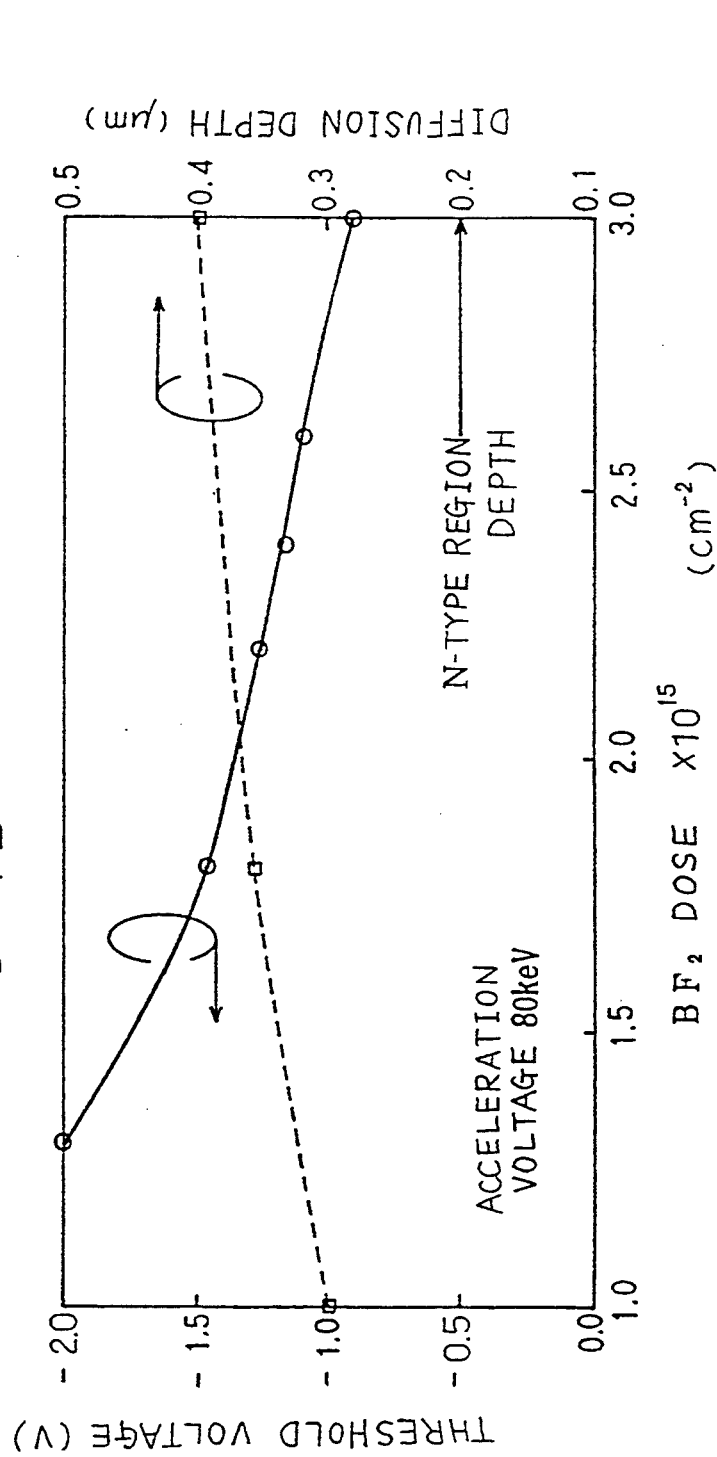

In the P-channel transistors, it should be noted that the threshold voltage is determined by the concentration level of the N-type diffusion regions 21b and 22b, particularly when the N-type diffusion regions 21b and 22b have a high impurity concentration level. In the device of the present embodiment, one can achieve a control of the threshold voltage relatively easily by setting the doses of the source and drain regions 23b and 24b appropriately. FIG. 4B shows the depth of diffusion for the source and drain regions 23b and 24b as well as the threshold voltage, as a function of the dose of $BF_2$, for a P-channel transistor thus formed with a gate length of 0.84 μm It will be seen from FIG. 4 that one can control the threshold voltage to a desired level by choosing an appropriate dose while forming the source and drain regions 23b and 24b to have an increased depth as compared with the N-type diffusion regions 21b and 22b.

Figure 5A:
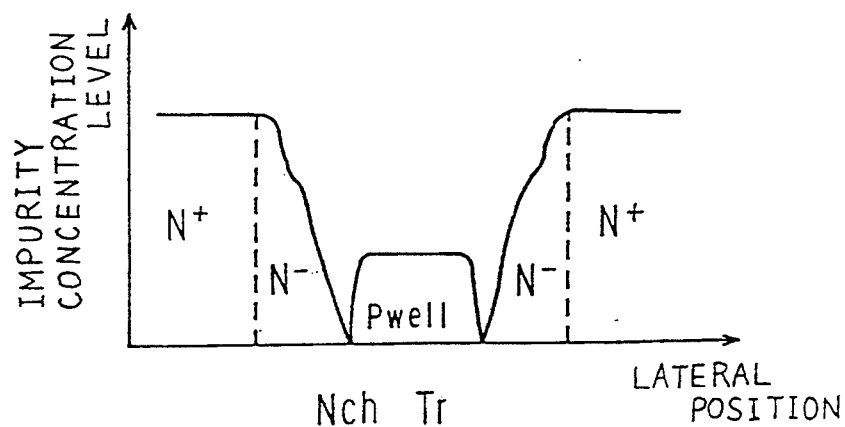
FIGS. 5A and 5B are diagrams respectively showing the lateral distribution of impurity elements in the N- channel transistor and in the P-channel transistor forming the device of the first embodiment.
Figure 5B:
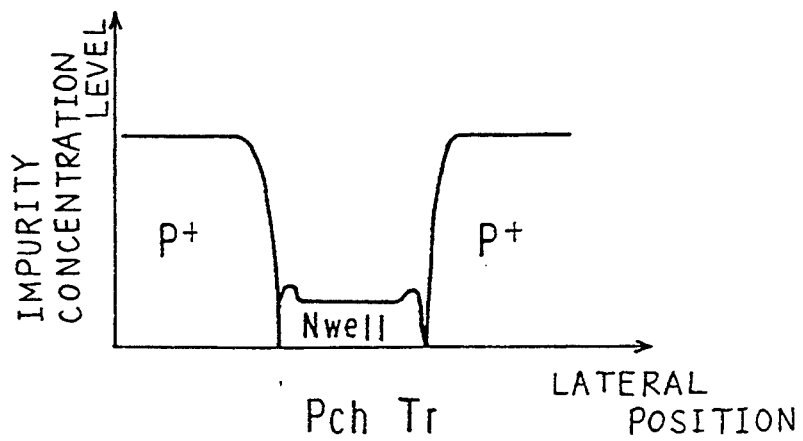

FIGS. 5A and 5B show respectively the impurity distribution profile, taken in the direction parallel to the principal surface of the substrate, for the N-channel transistor and the P-channel transistor. In the N-channel transistor, it will be noted that the concentration of the N-type dopant forming the N-type diffusion regions 21a and 21b, decreases gradually in correspondence to the region located immediately below the gate electrode 18. In the P-channel transistor, on the other hand, the P-type dopant decreases in correspondence to the edge of the source and drain regions 23b and 24b steeply. The structure having such an impurity concentration profile is suitable for reducing the electric field in the N-channel transistor sufficiently. Further, the structure is advantageous for suppressing the short channel effect in view of the fact that the depths of the N-type diffusion regions 21a and 22a do not exceed the depths of the source and drain regions 23a and 24a. Further, one can reduce the junction capacitance associated with the N-type diffusion regions 21b and 22b in view of the fact that the diffusion regions 21b and 22b do not protrude beyond the source and drain regions 23b and 24b in the depth direction. Thereby, the device of the present embodiment shortens delay time of circuits.

Second Embodiment

The complementary MIS transistor of the present invention according to a second embodiment will now be described. In the device of the present embodiment, the gate electrode 18 is formed to have a shape such that the lateral width of the gate electrode 18 decreases as increasing height from the principal surface of the substrate 11.

FIGS. 6A–6E show the fabrication process of the device of the second embodiment, wherein the drawings show only the part of the complementary MIS transistor wherein the P-type well is formed for the N-channel transistor. The illustration of the N-type well for the P-channel transistor is omitted, as the structure of the P-channel transistor is substantially identical with the structure of the N-channel transistor except for the conductivity type.

Figure 6A:
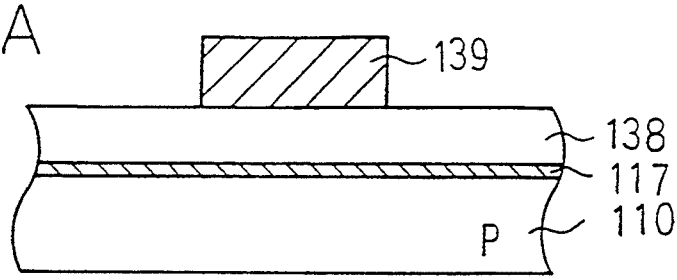

Referring to FIG. 6A, a gate oxide film 117 is formed on a principal surface of a P-type substrate 110 of single crystal silicon, similarly to the first embodiment. Further, a polysilicon layer 138 is deposited on the gate oxide film 117 and the polysilicon layer 138 is covered by a photoresist that in turn is patterned to form a mask 139.

Figure 6B:
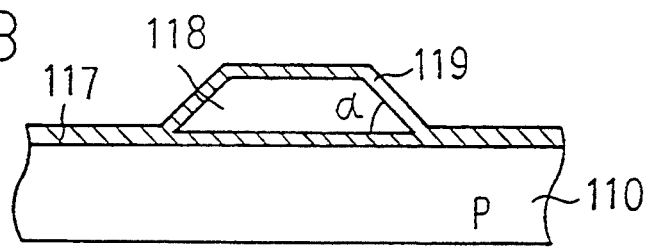

Next, as shown in FIG. 6B, the polysilicon layer 138 is subjected to an etching process that may be conducted typically by a dry etching process. In the dry etching process, one can form the gate electrode 118 to have a normal mesa form wherein the lateral width of the gate electrode 118 decreases as increasing height from the principal surface of the substrate, by setting the gas composition, pressure and electric power appropriately. It is preferable to form the electrode 118 such that the electrode 118 has a side wall that forms an angle $\alpha$, with respect to the principal surface of the substrate 110, such that the angle $\alpha$ is smaller than 90 degrees and preferably about 60 degrees–80 degrees.

Figure 6C:
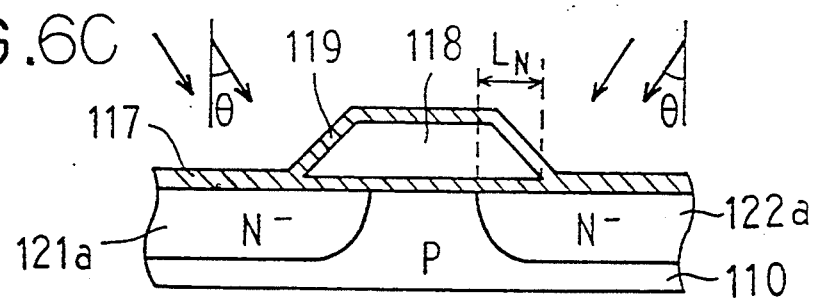

Next, the mask 139 is removed and an insulation film 119 is formed on the surface of the gate electrode 118 with a thickness of more than 20 nm. Further, an ion implantation of phosphorus is conducted from both sides of the gate electrode 118 as shown in FIG. 6C, such that the injected ions penetrate through the oblique side walls of the gate electrode 118. There, the ions are implanted with an incident angle $\theta$ that is set more than 10 degrees similarly to the case of the first embodiment. Next, N-type diffusion regions 121a and 122a are formed by applying a heat treatment process to the structure thus formed similarly to the first embodiment. Thereby, the diffusion regions 121a and 122a are formed to penetrate laterally into the region immediately below the gate electrode 118, by crossing the both lateral edges of the gate electrode 118.

By setting the angle $\alpha$ of the gate electrode 118 to be less than 90 degrees, one can secure a large diffusion length $L_N$, when measured from the bottom edge of the gate electrode 118, for the N-type diffusion regions 121a and 122a that are formed immediately below the gate electrode 118. Thereby, one can achieve a profile of the N-type dopant such that the concentration of the N-type dopant decreases continuously and gradually from both side edges of the gate electrode 118 to the central part thereof. Thereby, one can enhance the electric field relaxation in the N-channel transistor and improve the efficiency for suppressing the punch-through effect in the P-channel transistor.

FIG. 7 shows the relationship between the lateral diffusion length $L_N$ of the N-type diffusion regions 121a and 122a and the bottom angle $\alpha$ of the gate electrode 118 for various ion incident angles $\theta$. As will be understood from FIG. 7, the rate of change of the diffusion length $L_N$ with respect to the angle $\alpha$ decreases as increasing incident angle $\theta$. This indicates that one can obtain a relatively uniform diffusion length $L_N$ even when there are variations in the angle $\alpha$, when a large incident angle $\theta$ is employed.

Figure 6D:
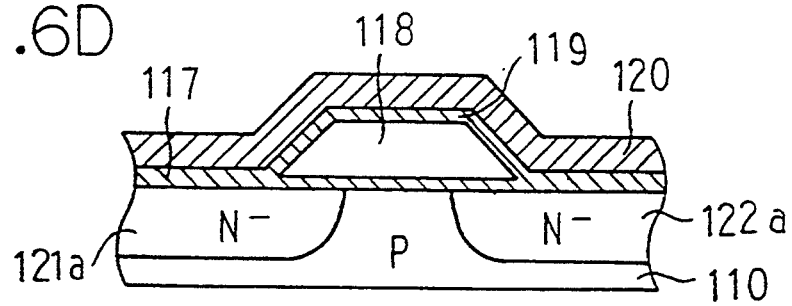
Figure 6E:
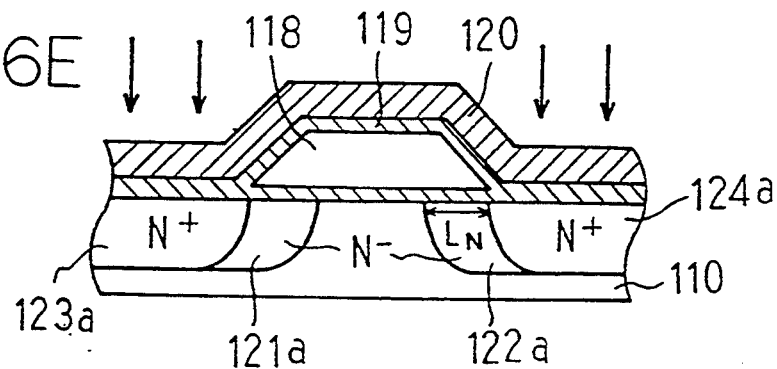

Next, as shown in FIGS. 6D, an insulation film 120 typically of nitride is provided on the surface of the substrate by a CVD, sputtering or evaporation deposition process. It should be noted that the insulation film 120 thus formed effectively prevents the ions from passing therethrough in the traveling direction of the ion beam. More specifically, the insulation film 120 allows only about 70% of the implanted ions to pass therethrough as compared with the gate oxide film 117 or the insulation film 119 under the same acceleration voltage. Further, the oblique side wall of the gate electrode 118 acts to increase the effective length of the insulation film 120 provided thereon in the direction normal to the substrate 110. Thereby, one can form source and drain regions 123a and 124a by an ion implantation process for introducing ions such as arsenic or phosphorus vertically to the substrate 110 such that the edge of the source and drain regions 123a and 124a coincide with the corresponding lateral edges of the trapezoidal gate electrode 118 at the bottom level of the gate electrode. As a result, one can form the N-type diffusion regions 121a and 122a to have an increased diffusion length $L_N$ while controlling the formation thereof accurately. In the P-channel transistor, on the other hand, the foregoing construction, enabling the formation of the source and drain regions such that the edges of the source and drain regions coincide with the corresponding edges of the gate electrode, is effective for suppressing the short channel effect and for controlling the channel length of the transistor.

Because of the construction of the gate electrode to have a width that decreases as increasing height, the device of the present embodiment is substantially free from the problem of the N-type diffusion regions 121a and 122a being introduced with ions that have passed through an adjacent electrode when forming the diffusion regions 121a and 122a by the ion implantation process.

Third Embodiment

Next, the fabrication process of the complementary MIS transistor according to a third embodiment of the present invention will be described. In the third embodiment, P-type diffusion regions 210 and 211 of reduced impurity concentration level are formed respectively within the N-type diffusion regions 21b and 22b in correspondence to the P-channel transistor, in correspondence to the part located immediately below the gate electrode 18, by implanting the ions obliquely into the N-type well 11b forming a part of the P-channel transistor in the first embodiment. More specifically, as shown in FIG. 8A, the P-type diffusion regions 210 and 211 are formed by conducting a process prior to the process of FIG. 2H of the first embodiment, such that boron or BF$_2$ ions are injected with an incident angle $\theta$ of more than 10 degrees while using the gate electrode 18 and the insulation film 20 as a mask. Thereby, the ion implantation is conducted such that the edges of the P-type diffusion regions 210 and 211 do not exceed the corresponding edges of the N-type diffusion regions 21b and 22b in terms of lateral as well as vertical directions.

Next, as shown in FIG. 8B that corresponds to the process of FIG. 2H of the first embodiment, boron or BF$_2$ ions are implanted vertically to the substrate 10 to form the source and drain regions 23b and 24b. The source and drain regions 23b and 24b are formed to have respective edges such that the source and drain regions 23b and 24b do not protrude beyond the P-type regions 210 and 211 in the lateral direction and such that the edges of the source and drain regions 23b and 24b coincide with the corresponding side edges of the gate electrode 18. In the vertical direction, the source and drain regions 23b and 24b are formed to penetrate and protrude beyond the lower edge of the N-type diffusion regions 21b and 22b.

In the P-channel transistors, there has been a problem that the sub-threshold characteristics of the device is deteriorated when the threshold voltage of the transistor is controlled to a desired value. In the present embodiment, the problem of degradation of the threshold characteristics is successfully eliminated by forming the P-type sub-diffusion regions 210 and 211 of low impurity concentration level.

Fourth Embodiment

Next, a fourth embodiment of the present invention will be described. In the fourth embodiment, the P-channel transistor of the third embodiment is adapted to form a high voltage P-channel transistor that requires a drain region of low impurity concentration for relaxing the electric field. When forming such a drain region to have low impurity concentration level lower than the usual drain formed of the P-type diffusion region of high impurity concentration level, there is a tendency that the N-type diffusion regions used for the punch-through stopper remain in the region located immediately below the gate region, with a large impurity concentration level. Thereby, there occurs a problem in that the high voltage P-channel transistor has a very high threshold voltage such as 1.5 volts.

In order to eliminate such an increase of the threshold voltage, the present embodiment conducts an ion implantation process of boron or BF$_2$ ions to form the P-type sub-diffusion regions 210 and 211 of low impurity concentration level such that the ions are implanted with the incident angle $\theta$ of more than 10 degrees, while using the gate electrode 18 and the insulation film 20 as a mask similarly to the third embodiment. Thereby, the ion implantation is controlled such that the edges of the P-type sub-diffusion regions 210 and 211 of low impurity concentration level do not exceed the edges of the N-type diffusion regions 21b and 22b in both the lateral and vertical directions.

When the structure of the P-channel transistor is already formed as in the case of the third embodiment, it is possible to reduce the number of times photolithographic process is conducted by applying an ion implantation simultaneously. Next, a photoresist 36 is applied in correspondence to the region wherein the electric field relaxation region pertinent to the high voltage transistor is to be formed, and an ion implantation of boron or BF$_2$ is conducted selectively in correspondence to the region wherein the P-type diffusion regions of high impurity concentration level is to be formed, generally in the direction perpendicular to the principal surface of the substrate 10. Thereby, source and drain regions 23b and 24b are formed. In the process described above, the ion implantation process is controlled such that the edge of the source region 23b does not exceed beyond the P-type diffusion region 210 of the low impurity concentration level in the lateral direction and such that the source region 23b penetrates vertically into the substrate 10 beyond the N-type diffusion region 21b. On the other hand, the drain region 24b is formed to have a depth that exceeds the depth of the N-type diffusion region 22b.

When the complementary MOS transistor is already formed with the P-channel transistor in the above processing step, one can reduce the number of times the photolithographic patterning process is conducted by applying an ion implantation process simultaneously as in the case described above, and the number of fabrication steps can be reduced accordingly. In the device formed according to the foregoing process, the control of the threshold voltage of the high voltage transistor can be controlled by the so-called channel ion implantation process. Thereby, one can fabricate a high voltage transistor without increasing the number of times the photolithographic process is employed.

In any of the foregoing embodiments, one can obtain various advantages described below.

(1) The N-type diffusion regions 21a, 22a, 21b, 22b, 121a and 122a are formed in the self-alignment process with respect to the gate electrode 18 or 118. Thereby, no special mask is needed for forming the electric field decreasing layer, contrary to the conventional LDD structure.

(2) The N-type diffusion region acts to relax the electric field in the N-channel transistor. In the P-channel transistor, the N-type diffusion region acts as an effective punch-through stopper.

(3) By employing the oblique ion implantation process, it is possible to obtain the distribution of implanted ions generally in conformity with the desired form of the N-type diffusion region. Thereby, the thermal diffusion process can be reduced in terms of the duration of heat treatment applied after the ion implantation process. Thus, the fabrication process of the present invention is suitable for fabrication miniaturized semiconductor devices.

(4) The N-type diffusion regions have a depth smaller than the depth of the diffusion regions of the high impurity concentration level. Thereby, the device having such N-type diffusion regions is effective for suppressing the short channel effect.

(5) The N-type diffusion regions, formed by the oblique ion implantation process, can be formed to have a reduced depth of diffusion and to have a form such that the N-type diffusion regions penetrate laterally into the region immediately below the gate electrode.

(6) The structure of the present invention, characterized by the N-type diffusion regions remaining selectively in the substrate at the part located immediately below the gate electrode after the process for forming the source and drain regions being completed, is capable of forming a carrier accumulation layer in correspondence to the N-type diffusion region in response to the application of a positive voltage to the gate electrode with respect to the substrate. Thereby, the problem of small output current pertinent to the conventional device that has the LDD structure is eliminated. In the conventional LDD device lacking the N-type diffusion region in the region of the substrate immediately below the gate electrode, the N-type diffusion region that forms the LDD structure has acted to increase the resistance of the device.

(7) In the device of the present invention, the source and drain regions are formed by an ion implantation process for introducing impurity ions with a high concentration level, wherein the implantation of the ions is conducted, after the N-type diffusion regions are formed, through the insulation film covering the side wall of the gate electrode. Thereby, the hot carrier resistance of the device is improved.

(8) The N-type diffusion regions suppress, in the P-channel transistor, the lateral punch-through effect. Thereby, the device of the present invention effectively eliminates the decrease of the threshold voltage caused by the short channel effect. A simulation indicates that a decrease of threshold voltage of as much as 0.2 volts is expected in a transistor of the single drain structure, wherein a gate length of 0.84 µm is assumed. In such a case, the transistor cannot be used for practical purposes. In the device of the present invention, on the other hand, one can eliminate the degradation of the threshold voltage successfully.

(9) In the device of the present invention, one can achieve a depth of diffusion for the source and drain regions of 0.3 µm or more, by setting the dose of $BF_2$ equal to $1 \times 10^{15}/cm^2$ or more. On the other hand, a depth of about 0.2 µm is sufficient for the N-type diffusion region that is used for the relaxation layer of electric field or for the punch-through stopper. Thereby, one can form the source and drain regions to have a depth that is substantially larger as compared with the N-type diffusion regions.

(10) The device of the present invention has a reduced junction capacitance and hence an improved operational speed.

Generally, the junction capacitance appearing in a one-sided step junction in response to application of a reverse bias voltage V, is represented as $$C(V) = (q\epsilon^N WELL/2(V_o - V))^{\frac{1}{2}} \quad (1)$$

wherein q represents the elementary electric charge, $\epsilon$ represents the dielectric constant of silicon, $^N$WELL represents the impurity concentration level in the N-type well, $V_o$ represents the built-in potential formed between the source or drain region (P-type diffusion region of high impurity concentration level) and the N-type well.

As it will be understood from Eq. (1), the junction capacitance C(V) increases as increasing concentration level in the N-type well.

In the conventional structure, it should be noted that the N-type diffusion regions are formed to have an increased lateral size and depth as compared with the source or drain region to secure the lateral extension necessary for the punch-through stopper. However such a structure inevitably invites increase of $^N$WELL and the parasitic capacitance increases in the depth direction of the source and drain regions.

In the present invention, on the other hand, the N-type diffusion regions are formed to have the necessary lateral extension by applying the ion implantation obliquely. Thereby, the problem of the N-type diffusion regions having an excessive depth is successfully avoided. In the depth direction, it is possible to form such that the source or drain region achieves a direct junction with the N-type well region. Thereby, one can achieve the reduction of the parasitic capacitance.

Thus, the transistor structure described with reference to the embodiments heretofore is suitable for miniaturization of the device, and provides an improvement in the operational speed. Thus, the complementary MIS transistor of the present invention can provide an integrated circuit having an improved integration density and improved operational speed.

What is claimed is:

1. A complementary MIS transistor, comprising: a substrate;
   a P-type well and an N-type well defined in said substrate;

an insulating gate provided on each of said P-type well and said N-type well;

a source region and a drain region both of N-type and formed in said P-type well so as to align respectively to a first edge and a second, opposite edge of said insulating gate that is provided on said P-type well;

a source region and a drain region both of P-type and formed in said N-type well so as to align respectively to a first edge and a second, opposite edge of said insulating gate that is provided on said N-type well; and N-type diffusion regions formed in correspondence to said source region and said drain region in each of said P-type well and said N-type well, said N-type diffusion region having an impurity concentration level that is higher than an impurity concentration level of said P-type well and said N-type well but is lower than an impurity concentration level of said source and drain regions, said N-type diffusion regions extending laterally from said source and drain regions into a part of said substrate located immediately below said first and second edges of said insulating gate, said N-type diffusion regions extending vertically in said substrate to a depth smaller than or equal to a depth of said source and drain regions.

2. A complementary MIS transistor as claimed in claim 1, wherein said N-type diffusion regions formed in said N-type well include a sub-diffusion region of P-type such that said sub-diffusion region has a lateral extension and a vertical depth that are smaller than a lateral extension and a vertical depth of said N-type diffusion regions, said sub-diffusion region has an impurity concentration level that is lower than an impurity concentration level of said P-type source and drain regions formed in said N-type well.

3. A complementary MIS transistor as claimed in claim 1, wherein said N-type diffusion regions has a lateral extension that is larger than a lateral extension of said source and drain regions, at a depth of 0.5 $\mu$m or less.

4. A complementary MIS transistor as claimed in claim 1, wherein said insulating gate has oblique side walls at said first and second edges such that said insulating gate has a lateral size that decreases with increasing height away from a principal surface of said substrate.

5. A complementary MIS transistor as claimed in claim 1, wherein said N-type diffusion regions are formed by an ion implantation process conducted obliquely to a principal surface of said substrate while using said insulating gate as a mask, such that said N-type diffusion regions extend to a region of said substrate located immediately below said first and second edges of said insulating gate.

6. A complementary MIS transistor as claimed in claim 4, wherein said N-type diffusion regions are formed by an ion implantation process conducted obliquely to a principal surface of said substrate while using said insulating gate as a mask, such that said N-type diffusion regions extend to a region of said substrate located immediately below said first and second edges of said insulating gate.

7. A complementary MIS transistor as claimed in claim 1, wherein said insulating gate is doped to N-type.

8. A complementary MIS transistor as claimed in claim 2, wherein said insulating gate is doped to N-type.

9. A complementary MIS transistor as claimed in claim 4, wherein said insulating gate is doped to N-type.

* * * * *